United States Patent [19]

Zwack

[11] Patent Number: 4,864,253

[45] Date of Patent: Sep. 5, 1989

[54] PHASE LOCKED LOOP WHEREIN PHASE COMPARING AND FILTERING ARE PERFORMED BY MICROPROCESSOR

[75] Inventor: Eduard Zwack, Puchheim, Fed. Rep. of Germany

[73] Assignee: Siemens Aktiengesellschaft, Berlin and Munich, Fed. Rep. of Germany

[21] Appl. No.: 247,409

[22] Filed: Sep. 21, 1988

[30] Foreign Application Priority Data

Dec. 22, 1987 [DE] Fed. Rep. of Germany ....... 3743631

[51] Int. Cl.$^4$ ........................ H03L 7/18; H03L 7/22
[52] U.S. Cl. ................................ 331/1 A; 331/2; 331/17; 331/25
[58] Field of Search ................ 331/1 A, 2, 17, 25, 331/27

[56] References Cited

U.S. PATENT DOCUMENTS 4,418,318 11/1983 Swagerty et al. ............ 331/1 A X
4,450,518 5/1984 Klee ............................ 331/1 A X

OTHER PUBLICATIONS

"A Microprocessor-Controlled Phase-Locked Loop for Network Synchronization", by Masatoshi Makino et al, Proceedings of 1979 ISCAS, pp. 804–805.

Primary Examiner—Siegfried H. Grimm
Attorney, Agent, or Firm—Hill, Van Santen, Steadman & Simpson

[57] ABSTRACT

A phase-locked loop is formed by a series circuit of a counter, a register, an arithmetic unit, a low-pass filter, a PI-filter, and a voltage-controlled oscillator. The digital, internal clock signals generated by the oscillator are counted in a counter and are transferred into the register and stored as a current counter reading at points in time determined by time interval clock signals. For example, the time interval clock signals are acquired from reference clock signals by means of a divider and exhibit a lower frequency than the internal clock signals. A drive signal in digital form is determined in the arithmetic unit on the basis of the current counter reading, on the counter reading of the preceding evaluation interval, and on a rated value. This drive signal proceeds via a digital low-pass filter, PI-filter, and D/A converter to the control input of the oscillator, and controls the latter such that the internal clock signals coincide in phase with the reference clock signals.

18 Claims, 2 Drawing Sheets

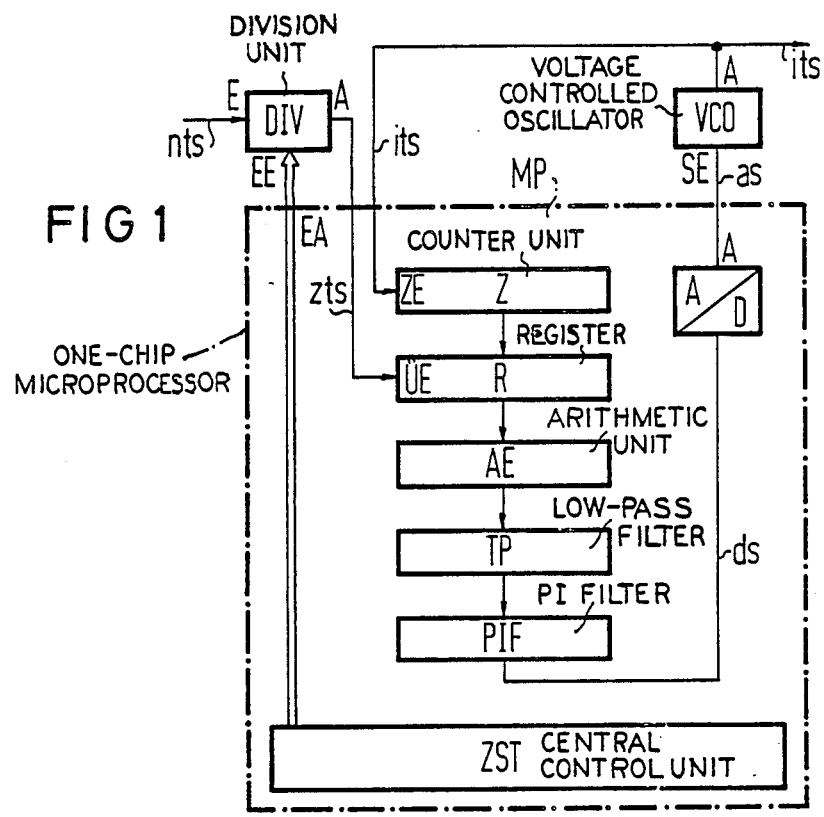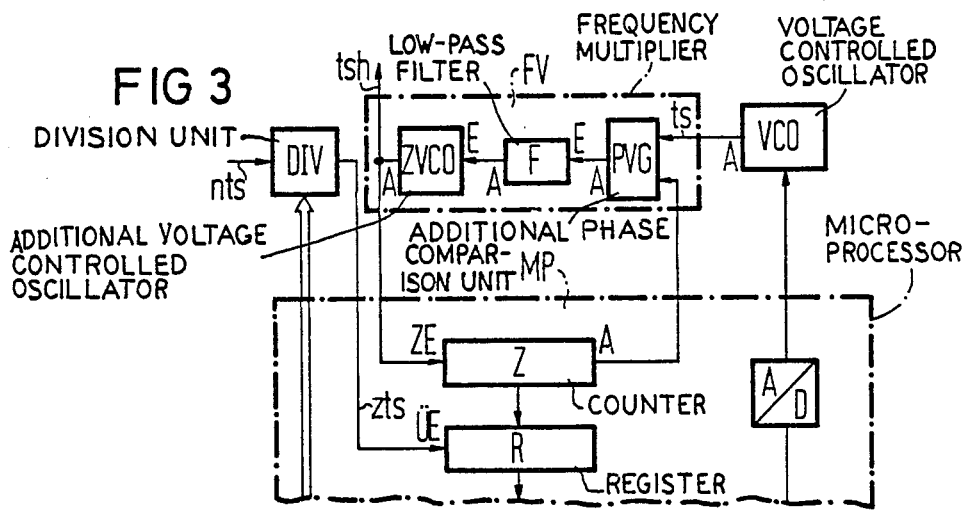

PHASE LOCKED LOOP WHEREIN PHASE COMPARING AND FILTERING ARE PERFORMED BY MICROPROCESSOR

BACKGROUND OF THE INVENTION

In digital communication networks, clock signals—referred to below as network clock signals—are communicated to the individual network components such as, for example, switching equipment either separately or within the information flow. In switching equipment such as, for example, private branch exchange systems, the received network clock signals are usually not directly utilized for clock control of the individual components of the switching equipment since, given outage of the network clock signals, the switching equipment would no longer be controllable, or would assume an undefined operating condition. For this reason, the received network clock signals are conducted to a phase-locked loop in which internal clock signals are formed and are communicated to the individual components of a subscriber station.

The following functions must be realized in such a phaselocked loop:
internal clock pulses are generated in an internal voltage-controlled oscillator - referred to below as a VCO oscillator;
the frequency of the network clock signals is matched to the frequency of the internal clock signals; and
the internal VCO oscillator is controlled such that the phases of the network clock signals and of the internal clock signals coincide in order to
1. be able to directly process information communicated from the communications network in the switching equipment, and
2. avoid a phase skip in one of the internal clock signals given outage of the network clock signals.

In addition to integrated circuits, microprocessors of suitable scope are being utilized to an increasing degree in phase-locked loops. The publication "Proceedings of 1979 ISCAS", pages 804 through 805 incorporated herein discloses a phase-locked loop that first, exhibits the function features set forth above and, second, is equipped with a microprocessor system. This phase-locked loop is composed of a digital phase comparator, of a digitally controlled oscillator, of a control means, and of two divider means. The frequency of the supplied network clock signals is reduced in the first divider means. These network clock signals having a modified frequency are subsequently forwarded to a digital phase comparison means. The phase comparison means is provided with a phase comparator and with a counter. The internal clock pulses generated in a digitally controlled oscillator are additionally supplied to the phase comparison means via the second divider means. The divider means are dimensioned such that the frequency of the network clock signals present at the phase comparator approximately coincides with that of the internal clock signals. The two clock signals are compared in the phase comparator in terms of their phase relation; and the result of the comparison is supplied to the counter. The internal clock signals are also communicated to the counting input of the counter. When the phases of the two clock signals deviate from one another, then internal clock signals are read into the counter and are counted. The result of the count is forwarded to a control means realized by a microprocessor system. The counter readings representing the phase deviations are identified in this control means, are filtered with a low-pass filter, and are conducted to an externally arranged D/A converter as digital voltage values. The analog output voltages output by the D/A converter control a VCO oscillator such that the internal clock signals generated by the VCO oscillator coincide with the network clock signals in terms of their phase relation. Together, the VCO oscillator and the D/A converter form the digitally controlled oscillator.

It proceeds from the above noted publication that the individual system components of the control circuit such as the phase comparator, counter, oscillator and D/A converter are not integrated into the control means. Also, the publication contains no references as to how the individual hardware components, and particularly the phase comparator, can be realized. Furthermore, the phase-locked loop can only be adapted to different network clock and VCO clock signal frequencies by modifying or replacing hardware components.

SUMMARY OF THE INVENTION

Based on the employment of a microprocessor system in a phase-locked loop, an object of the invention is to design this phase-locked loop such that a simple matching to different network clock and VCO clock signal frequencies is enabled, and wherein all system components or their functions are realizable in the microprocessor system in optimum fashion.

According to the invention, a microprocessor is provided having a counter means connected to receive the internal clock signals. The counter means outputs to a register means connected to receive time interval clock signals derived from the network clock signals. The register means connects to an arithmetic means for determining a difference between a current counter reading stored in the register means and a counter reading of a preceding evaluation interval. A phase deviation is determined based on said difference minus a rated value established based on an analog drive voltage for the voltage controlled oscillator at a nominal frequency of the oscillator. The phase deviations are summed up and provided to a low-pass filter means, which outputs to integrating means, which in turn provides digital drive signals which are converted in a digital-to-analog converter to provide an analog drive voltage for the voltage controlled oscillator. The counter means, register means, arithmetic means, low-pass filter means, integrating means, and digital-to-analog converter means, all of which are part of a microprocessor, provide a phase-locked loop for control of the voltage controlled oscillator.

The series circuit of the counter, of the register, and of the arithmetic means effects an extremely simple matching to different frequencies of the two clock signals, since the components of the phase-locked loop can be dimensioned (for example, the counter and register length), such that an information representing the phase deviation of the two clock signals can be identified for extremely different clock signal frequencies, and a drive voltage signal for the voltage-controlled oscillator can be formed.

A further advantage of the series circuit of the counter, of the register, and of the arithmetic means may be seen in its extremely simple realizability in a microprocessor system for counting, storing, and simple arithmetic operations. This means that the phase-locked loop can be largely realized in a microprocessor system since - as already initially set forth-integrating low-pass filter functions and PI filter functions in a microprocessor system for each program are known.

The control precision of the phase-locked loop is critically dependent on the frequency of the clock signals, on the duration of the evaluation intervals, and on the time constants or control speeds of the following filters and integrators that are matched thereto. A higher frequency of the clock signals effects a higher resolution in the identification of the phase deviations. The control voltage can be identified with greater precision the greater the resolution is, i.e. the more precise the identified phase deviation per evaluation duration. It must therefore be noted that, in particular, the time constant of the low-pass filter is to be kept optimally low. Dependent on the frequency of the clock signals, this occurs since the evaluation interval duration and the time constants or control speeds of the filters and integrators are matched to one another.

In an advantageous improvement of the embodiment of the invention, the components of the phase-locked loop are controllable and monitorable from a central control. This applies particularly for such an implementation of the method of the invention in a microprocessor system wherein all program parts are advantageously coordinated, monitored, and initialized by a central control.

The versatile possibilities of fault recognition, fault reporting, and display, which are possible based on the design of the programs, are to be particularly emphasized. For example, the presence of the reference and clock signals can be monitored. When the clock signals coming from the oscillator are absent, such absence can be reported or displayed. Further, for example, the presence of reference clock signals, to whose frequency the phase-locked loop cannot be synchronized, can be recognized and reported or displayed. Since the switching equipment is usually connected to the digital communication network via a plurality of lines communicating the reference clock, a switch to redundantly offer referenced clock signals can usually be undertaken given absence of one of the reference clock signals.

The condition that the frequency of the time interval/clock signals is lower than the frequency of the clock signals—is advantageously met since the interval clock signals are acquired from the reference clock signals by means of a divider means that is variable in terms of its division ratio. This division means can be provided either by a program in the microprocessor system that contains the phase-locked loop, or can be provided as a hardware means. The type of construction is essentially dependent on the frequency of the reference clock signals. Given high frequencies, i.e. higher than the maximum processing speed of the microprocessor system, a hardware construction for the division means is required. When the frequency lies below the maximum processing speed of the microprocessor system, then a hardware or software construction is possible. The software approach, however, is to be preferred since a simple matching to the greatest variety of operating conditions of the phase-locked loop can be undertaken by modifying the programs. This does better justice to the stated object of integrating an optimum plurality of components of the phase-locked loop in a microprocessor system.

The variation of the division ratio of the division means is implemented by the central control with particular advantage both in a hardware as well as in a software construction, i.e. via a program input, since, as a result thereof, a setting of the division ratio by externally arranged mechanical switch means can be avoided. Given a hardware construction of the division means, for example as a frequency divider chain having a variable division factor, the division factor and thus the division ratio can be set via additional control connections between the microprocessor system and the frequency divider chain.

The automatic identification and setting of the division ratio of the division means represents an especially advantageous design with respect to the division means. The frequency of the reference clock signals supplied to the phase-locked loop is thereby identified, the division ratio is determined with the assistance of the central control means, and the division means is appropriately set. The frequency of the reference clock signals is measured with the assistance of a frequency measuring means that is likewise realizable by a program. The division ratio can therefore be determined such that respective time interval clock signals of identical duration are present at the output of the division means. Different time interval clock signals can also be determined by the division ratio. However, evaluation interval duration and time constants or control speeds of the following low-pass filters and PI-filters may then have to be matched.

The insertion of additional components or functions of the employed phase-locked loop between those that are already present is possible on the basis of the conception of the method of the invention and of the high adaptability to different clock signal frequencies that is thus achieved. This phase-locked loop can be utilized with particular advantage or forming a frequency multiplication means or a highly constant voltage-controlled oscillator. Further equipment can be formed, for example by inserting delay units, additional analog components or additional filter functions given a corresponding adaptation of the phase-locked loop.

As already set forth, all components of the phase-locked loop, with the exception of the voltage-controlled oscillator, are realizable in a microprocessor system.

The use of a program connected therewith increases the adaptability of the phase-locked loop to the greatest variety of conditions. What is thus to be understood, for example, is a matching to different clock frequencies—even during operation given outage of the reference clock signals and switching to reference clock signals of a different frequency. Furthermore, a matching to different oscillator control speeds—for example, dependent on the quality of the clock signals—and to different oscillators with respect to the drive voltage conditions, is also possible. The matching can automatically occur during operation. Additional detectors such as, for example, a frequency measuring means, are to be inserted for this purpose. The matching can manually occur on the basis of suitable program modifications—for example by loading a program.

In a further advantageous development of the invention, the microprocessor system can be constructed by a one-chip microprocessor having an integrated D/A converter. With respect to space requirements and economic feasibility, this represents an especially advantageous embodiment of the invention, since only the voltage-controlled oscillator need be allocated to the one-chip microprocessor for the formation of the phase-locked loop. When the reference clock frequency of the oscillator clock signal frequency lies significantly above the processing speed of the microprocessor, a division means having a variable division ratio is also allocated to the one-chip microprocessor.

In an advantageous development of the invention, the functions allocated to the components of the phase-locked loop are predominantly realizable in a customized, integrated circuit. Integrated circuits in the ASIC "Application Specified Integrated Circuit" technique are especially suitable for this purpose. These circuits contain a one-chip microprocessor system and a region that can be occupied by hardware specified by the customer. This circuit represents the most advantageous realization of the invention given high frequencies of the clock signals, since those components of the phase-locked loop that process the clock signals are realizable in hardware and those components of the phase-locked loop that undertake the calculation of the phase deviations and of the drive signals of the oscillator are realizable in software.

Possible realizations and exemplary embodiments of the method of the invention or of the arrangement of the invention shall be set forth in greater detail below with reference to block circuit diagrams and to a flow chart.

BRIEF DESCRIPTION OF THE DRAWINGS

FIG. 1 is a block circuit diagram of a phase-locked loop;

FIG. 3 is a frequency multiplication means or highly stable, voltage-controlled oscillator that is formed with the phase-locked loop of the invention.

DESCRIPTION OF THE PREFERRED EMBODIMENTS

Figure 2:
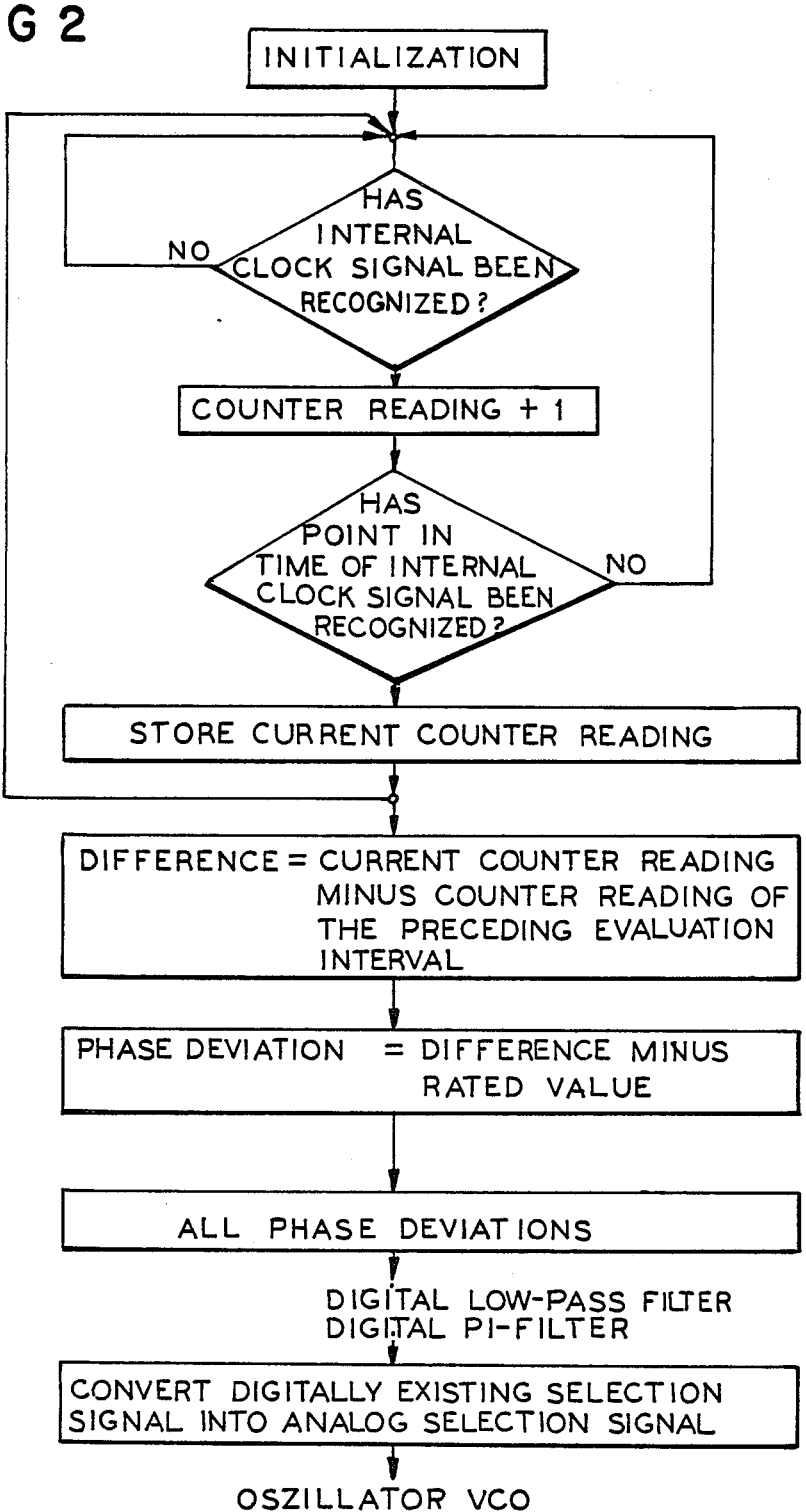
FIG. 2 is a flow chart for explaining the block circuit diagram of FIG. 1.

FIG. 1 shows those components of a phase-locked loop required for explanation. Let it be assumed that the phase-locked loop is formed by a voltage-controlled oscillator VCO—referred to as an oscillator below—, by a division unit DIV, as well as by a one-chip microprocessor MP. The oscillator VCO is composed, for example, of an integrated crystal oscillator circuit as well as of a pulling circuit with which the oscillator frequency is controllable in prescribed limits. Since the pulling circuit is usually realized by capacitance diodes, a frequency modification is achieved by variation of a dc voltage applied to a voltage input SE of the oscillator VCO. This dc voltage is referred to below as drive voltage. The division unit DIV contains a divider chain formed of integrated circuits at whose setting inputs EE the division factor or the division ratio is set. Network clock signals nts are conducted to an input E of the division unit DIV. These network clock signals nts, for example, are derived from clock information communicated via a communications network, and are derived with suitable equipment.

A counter unit Z, a register R, an arithmetic unit AE, a low-pass filter TP, a PI filter PIF and a D/A converter are connected in series following one another in the one-chip microprocessor MP. For the purpose of initialization, of control, and of monitoring the components, the one-chip microprocessor MP contains a central control unit ZST. The division factor of the divider chain realized in the division unit DIV, for example by the program input, is set with the assistance of this central control unit ZST via the setting outputs EA that are connected to the setting inputs EE of the division unit DIV. An output A of the division unit DIV is connected to an acceptance input UE of the register R via an appropriate connection. An output A of the D/A converter D/A is conducted to the voltage input SE of the oscillator VCO. Digital clock signals are available at the output of the oscillator VCO. These digital clock signals are conducted first to further processing devices as internal clock signals its. Secondly, they also proceed to a counting input ZE of the counter Z via an appropriately arranged connection. All devices in the one-chip microprocessor MP are realized by programs adapted to the respective one-chip microprocessor MP. The utilization of a one-chip microprocessor MP formed of an integrated D/A converter D/A is especially advantageous. The user programming or development expense can be reduced as a result thereof.

The individual functions of the components of the phase-locked loop and their interaction shall be set forth below with the assistance of the flow chart shown in FIG. 2. After the phase-locked loop is turned on—i.e. application of the supply voltage, the phase-locked loop is initialized with the assistance of the central control unit ZST. For this purpose, the central control unit ZST drives all components of the phase-locked loop, and particularly the components in the one-chip microprocessor MP, into a defined initial condition such as, for example, resetting register R and inputting arithmetic operation parameters, etc.

After the recognition of each and every internal clock signal its which is output by the oscillator VCO and conducted to the counting input ZE of the counter unit Z in the counter unit Z, the counter reading Z is incremented by one. This procedure of recognizing the internal clock signal its and incrementing the counter reading is repeated until an information signal change is identified at the acceptance input UE of the register R. Such an information change, for example, is the transition from a TTl high to a TTL low voltage level. When an information change of the time interval clock signals zts is then identified, then the counter reading currently present in the counting unit Z is transferred into the register R and is stored there. Subsequently, the recognition of the internal clock signals its and the respective incrementation of the counter reading by one is continued. At the same time, the stored counter reading is forwarded to the arithmetic unit AE. The following calculations are carried out in the arithmetic unit AE in the following sequence:

identification of the evaluation interval when the duration of a time interval clock signal zts does not correspond to the duration of an evaluation interval;

identification of the difference between the current counter reading and the counter reading of the preceding evaluation interval;

identification of the current phase deviation by subtracting a rated value from the identified counter reading difference (the rated value represents the drive signal for the oscillator VCO at its nominal frequency); and summing up all phase deviations identified per evaluation interval.

The phase deviation information identified in the arithmetic means AE are conducted via digital low-pass filter TP for rectification and are conducted via digital PI-filter for a voltage-oriented and controlled speed matching. The drive signals ds for the oscillator VCO that are now present in digital form are converted into analog drive signals as in a D/A converter and are conducted to the voltage input SE of the oscillator VCO via a corresponding output of the one-chip microprocessor system MP.

The evaluation interval determines the control speed of the phase locked loop (PL). In the evaluation interval the determined counter counts per time interval are summed up for one or more time intervals. If a single difference of the counter count compared to the preceding counter count is created for many time intervals, the PLL has a slow control speed, since a new oscillator drive signal is only created after many time intervals. Thus, phase fluctuations can be leveled within an evaluation interval. A final determination of the number of time interval clock signals per evaluation interval depends on the application and the desired control speed associated therewith.

FIG. 3 shows a means that can be utilized both as a frequency multiplier as well as a highly constant, voltage-controlled oscillator. This means is equipped with a phase-locked loop realized in accordance with FIG. 1 and FIG. 2. The arrangements or the functions of the components realized in the one-chip microprocessor system MP thus correspond to those set forth in FIG. 1 and FIG. 2. In accordance with FIG. 1, the time interval clock signals zts are acquired from the network clock signals nts with a division means DIV, and are conducted to the acceptance input UE of the register R. Likewise in accordance with FIG. 1, the oscillator VCO is connected to the one-chip microprocessor MP and is controlled by the latter. The significant difference over FIG. 1 is in the insertion of a frequency multiplier FV between the output of the oscillator VCO and the counting input ZE of the counter Z. The frequency multiplier FV is formed by a series circuit of an additional phase comparison unit PVG, of a low-pass filter F, and of an additional, voltage-controlled oscillator ZVCO. The output of the additional, voltage-controlled oscillator ZVCO that has a higher frequency is thus connected to the input ZE of the counter Z. The output A of the oscillator VCO is connected to an input of the phase comparison unit PVG. The remaining input of the phase comparison unit PVG is connected to that output A of the counter Z which was previously not used. This apparatus can now be used both as a frequency multiplication means as well as a highly constant, voltage-controlled oscillator. Given employment as a frequency multiplication means, the clock signals tsh having a higher or a multiplied frequency are available at the output of the additional oscillator ZVCO, and for example, can be conducted as clock signals to further-processing means of switching equipment. The control precision of the phase-locked loop is increased by the frequency elevation of the oscillator clock signals its as already set forth. The oscillator VCO is thus more exactly or more precisely controlled. When an oscillator VCO that is already highly stable is then additionally employed, then this is likewise controllable with high precision in terms of its frequency, whereby the means can be utilized as a high-precision, voltage-controlled oscillator. A further technique (not shown) for increasing the control precision of the phase-locked loop is the insertion of a delay unit instead of the frequency multiplier. The appearance of a polarity change of the time interval clock signals or of the reference clock signals its can thus be identified at time intervals which are shorter than a time interval of a clock pulse its. This additional acquired information is additionally involved in the calculation of the phase deviation. A prerequisite for the application of this technique, however, are low-noise network clock signals nts which, for example, are present when communicated from a first phase-locked loop to a second phase-locked loop provided as a standby control circuit.

Although various minor changes and modifications might be proposed by those skilled in the art, it will be understood that wish to include within the claims of the patent warranted hereon all such changes and modifications as reasonably come within my contribution to the art.

I claim as my invention:

1. A phase-locked loop system in which a drive voltage is determined for a voltage-controlled oscillator to be synchronized to network clock signals, comprising:
   a voltage controlled oscillator means for creating at an output thereof internal clock signals;
   means for creating time interval clock signals from the network clock signals such that said time interval clock signals have a frequency which is lower than a frequency of the network clock signals;
   counter means connected to receive and count said internal clock signals;
   register means connected to the counter means for receiving a count therefrom and also connected to said time interval clock signals such that a current counter reading is transferred into the register means and stored at time points defined by said time interval clock signals;
   arithmetic means connected to receive the stored counter readings from the register means for defining an evaluation interval corresponding to a selectable plurality of said time interval clock signals, for defining a current counter reading for each evaluation interval, for forming a difference between a current evaluation interval counter reading and a counter reading corresponding to a preceding evaluation interval, for determining a phase deviation by comparing said difference to a rated value which is indicative of a drive voltage for said voltage controlled oscillator means at a nominal frequency of the oscillator means, and for summing up said phase deviations;
   filter means connected to receive the summed up deviations and for providing digital drive signals;
   digital-to-analog converter means for converting said digital drive signals to an analog drive voltage connected to control said voltage controlled oscillator means; and
   said counter means, register means, arithmetic means, filter means and digital-to-analog converter means forming a phase-locked loop to control said voltage-controlled oscillator means.

2. A system according to claim 1 wherein said filter means comprises a low-pass filter followed by a PI filter.

3. A system according to claim 1 wherein a central control means is provided for monitoring a presence of said network clock signals and said internal clock signals, and wherein an absence of network clock signals can be detected by the central control means.

4. A system according to claim 1 wherein a central control means is provided for recognizing and reporting when network clock signals are present having a frequency to which the system cannot be synchronized.

5. A system according to claim 1 wherein the internal clock signals connected to said counter means are processed in a frequency multiplier unit wherein a phase comparison means receives the internal clock signals together with an output of the counter means, and provides a phase compared output signal to an additional low-pass filter means, said additional low-pass filter means providing an output to an additional voltage controlled oscillator means, which output provides said internal clock signals in modified form to said counter means.

6. A phase-locked loop voltage controlled oscillator system for providing internal clock signals based on reference clock signals, comprising:
a voltage controlled oscillator means having an analog voltage control input and an output at which said internal clock signals are provided;
division means for creating time interval clock signals based on network clock signals; and 7. A phase-locked loop system synchronized to reference clock signals, comprising:
division means for creating time interval clock signals from the reference clock signals such that said time interval clock signals have a lower frequency than the reference clock signals;
a voltage controlled oscillator means for creating at an output thereof internal clock signals;
counter means connected to receive and count said internal clock signals;
register means connected to the counter means for receiving a count therefrom and also connected to said time interval clock signals such that a current counter reading is transferred into the register means and stored at points in time defined by said time interval clock signals;
arithmetic means connected to receive the stored counter readings from the register means for forming a difference between a current counter reading and a counter reading of a preceding time point, said arithmetic means determining a phase deviation by comparing said difference to a rated value which is indicative of a control drive voltage for said voltage controlled oscillator means at a nominal frequency of the oscillator means, and said arithmetic means then summing up said deviations from the rated value for all of the time points;
digital low-pass filter means connected to receive the summed up deviations and for supplying output signals;
integrating means for receiving said output signals and creating digital drive signals; and
digital-to-analog converter means for converting said digital drive signals to an analog drive voltage connected to control said voltage controlled oscillator means.

8. A system according to claim 7 wherein means are provided for matching time constants of the low-pass filter means and integrating means to one another depending upon a frequency of said internal clock signals.

9. A system according to claim 7 including means for matching control speeds of the low-pass filter and integrating means to one another dependent on a frequency of said internal clock signals.

10. A system according to claim 7 wherein a central control means is provided for controlling said division means.

11. A system according to claim 10 wherein said central control means at least partially controls and monitors at least one of said counter means, register means, arithmetic means, low-pass filter means, and integrating means.

12. A system according to claim 1 wherein said division means for creating said time interval clock signals from said network clock signals has a variable division ratio.

13. A system according to claim 12 wherein said division ratio of the division means is variable through control of a central control means.

14. A system according to claim 7 wherein a frequency measuring means is provided for measuring a frequency of said network clock signals; and dependent on a magnitude of said identified frequency, a division ratio of said division means is determined and set through use of a central control means.

15. A system according to claim 7 wherein said integrating means comprises a PI filter and wherein a phase-locked loop is formed by a series circuit of said counter means, register means, arithmetic means, low-pass filter means, PI filter, digital-to-analog converter means, and voltage controlled oscillator means.

16. A system according to claim 15 wherein a division ratio of said division means is adjustable by a central control means, which central control means also monitors the phase locked loop.

17. A system according to claim 7 wherein said counter means, register means, arithmetic means, low-pass filter means, integrating means, and a central control means for setting a division ratio of said division means comprises a microprocessor.

18. A system according to claim 17 wherein said microprocessor comprises a one-chip microprocessor with said digital-to-analog converter means integrated thereon. oscillator means, and said arithmetic means then summing up said deviations from the rated value for all of the time points;
digital low-pass filter means connected to receive the summed up deviations and for supplying said output signals and creating digital drive signals; and
digital-to-analog converter means for converting said digital drive signals to an analog drive voltage connected to control said voltage controlled oscillator means.

* * * * *